United States Patent
Braunschweig et al.

(10) Patent No.: US 9,618,840 B2
(45) Date of Patent: Apr. 11, 2017

(54) SYSTEMS AND METHODS FOR POLYMER TIPS USING SILANATED SUPPORTS

(71) Applicant: New York University, New York, NY (US)

(72) Inventors: Adam B. Braunschweig, New York, NY (US); Xiao Zhong, Jersey City, NJ (US); Kevin B. Schesing, Cliffside Park, NJ (US); Shudan Bian, New York, NY (US)

(73) Assignee: NEW YORK UNIVERSITY, New York, NY (US)

( * ) Notice: Subject to any disclaimer, the term of this patent is extended or adjusted under 35 U.S.C. 154(b) by 334 days.

(21) Appl. No.: 14/083,981

(22) Filed: Nov. 19, 2013

(65) Prior Publication Data
US 2014/0141167 A1    May 22, 2014

Related U.S. Application Data

(60) Provisional application No. 61/728,672, filed on Nov. 20, 2012.

(51) Int. Cl.
| B05D 1/28 | (2006.01) |
| G03F 7/00 | (2006.01) |
| G03F 7/20 | (2006.01) |

(52) U.S. Cl.
CPC .......... *G03F 7/0002* (2013.01); *G03F 7/2049* (2013.01)

(58) Field of Classification Search
CPC ..... G03F 7/0002; G03F 7/2049; G01Q 70/06; G01Q 70/14; G01Q 70/16
See application file for complete search history.

(56) References Cited

U.S. PATENT DOCUMENTS

| 5,776,748 | A  | * | 7/1998 | Singhvi | B01J 19/0046 435/174 |
| 6,014,930 | A  | * | 1/2000 | Burberry | B41C 1/1041 101/456 |
| 6,596,346 | B2 | * | 7/2003 | Bernard | B41C 3/04 427/489 |
| 7,665,983 | B2 | * | 2/2010 | Kendale | B29C 33/10 249/117 |
| 9,079,338 | B2 | * | 7/2015 | Zheng | G03F 7/0002 |
| 2004/0115826 | A1 | * | 6/2004 | Budach | B82Y 20/00 436/172 |
| 2011/0132220 | A1 | * | 6/2011 | Mirkin | B82Y 10/00 101/483 |
| 2012/0076860 | A1 | * | 3/2012 | Trout | A61K 9/14 424/489 |

(Continued)

OTHER PUBLICATIONS

Pla-Roca, Mateu, et al., "Micro/Nanopatterning of Proteins via Contact Printing Using High Aspect Ratio PMMA Stamps and NanoImprint Apparatus" Langmuir 2007, 23, 8614-8618.*

(Continued)

*Primary Examiner* — Wyatt Stoffa
(74) *Attorney, Agent, or Firm* — Foley & Lardner LLP

(57) ABSTRACT

Polymer Pen Lithography materials that retain the simplicity characteristic for the fabrication of poly(dimethyl siloxane) tip arrays while preserving the control over feature dimensions and to understand the role of the mechanical properties of the different materials on Polymer Pen Lithography printing.

10 Claims, 5 Drawing Sheets

(56) References Cited

U.S. PATENT DOCUMENTS

| | | | | |
|---|---|---|---|---|
| 2012/0097058 A1* | 4/2012 | Mirkin | ............... | B01J 19/0046 |
| | | | | 101/483 |
| 2012/0128882 A1* | 5/2012 | Mirkin | ................ | B82Y 40/00 |
| | | | | 427/256 |
| 2013/0302464 A1* | 11/2013 | Zheng | ................ | G03F 7/0002 |
| | | | | 425/385 |
| 2015/0309073 A1* | 10/2015 | Mirkin | ................ | B82Y 40/00 |
| | | | | 850/55 |

OTHER PUBLICATIONS

Seed, Brian, "Silanizing Glassware" Current Protocols in Cell Biology (2000) A.3E.1-A.3E.3.*

Pla-Roca, Mateu, et al., "Micro/Nanopatterning of Proteins via Contact Printing Using High Aspect Ratio PMMA Stamps and NanoImprint Apparatus" Langmuir 2007, 23, 8614-8618.*

MacMillan, John H. "Using silanes as adhesion promoters." Computational Chemistry List, disponivel em< www. ccl.net/cca/documents/MacMillan_Papers/adhesion. pdf>, acesso em 28.11 (2009).*

Brzoska, J. B., et al. "Silanization of Solid Substrates: A Step Toward Reproducibility" Langmuir 1994 10 (11), 4367-4373.*

* cited by examiner

SYSTEMS AND METHODS FOR POLYMER TIPS USING SILANATED SUPPORTS

CROSS-REFERENCE TO RELATED PATENT APPLICATIONS

This application claims priority to 61/728,672 filed Nov. 20, 2012, incorporated herein by reference in its entirety.

STATEMENT OF GOVERNMENT INTEREST

The United States Government has rights in the invention described herein pursuant to an Air Force Office of Scientific Research for a Young Investigator Award (FA9550-11-1-0032), the National Science Foundation Award Number DBI-115269.

FIELD OF THE INVENTION

The field of the certain embodiments of invention generally relates molecular printing techniques. More specifically, the field of certain embodiments of invention relates to polymer tips for use in polymer pen lithography.

BACKGROUND OF THE INVENTION

Polymer Pen Lithography (PPL) is a recently developed molecular printing technique that employs an array of pyramidal, elastomeric tips to pattern soft organic and biologically-active inks onto surfaces with micrometer to nanometer scale feature dimensions. PPL has attracted wide interest because of its broad ink and substrate scope, the low-cost of the tip-arrays, the precise control over feature size and pattern design afforded by the piezoelectric actuators that move the tips, and the ability to form combinatorial arrays for applications including multiplexed detection and sensing. Many of the advantageous properties of this lithographic method arise directly from the array fabrication protocol and the chemical and mechanical properties of the elastomer. By curing poly(dimethyl siloxane) (PDMS) in a reusable master prepared by conventional photolithographic techniques, tip arrays mounted onto a glass support with as many as $10^7$ tips are prepared in a process that takes approximately 2 days. To transfer inks from the tips to a surface, an aqueous meniscus forms that is a conduit for ink transport. As a result of the meniscus, there is a well-known linear relationship between the square root of the dwell-time that the tips rest on the surface during printing and the resulting feature diameter that is also common to another popular tip-based lithography strategy, dip-pen nanolithography (DPN). Unlike DPN, which uses the Si tips on the cantilevers of atomic force microscope (AFM) probes as a stylus, the elastomers employed in PPL deform upon contact with the surface, so the force applied between the tip array and the surface is another parameter that, in addition to dwell-time, can be manipulated to achieve nanoscale control over feature dimensions.

While the compressibility of the PDMS tips typically used for PPL provides increased control over feature dimensions, tip deformation may not always be desirable, and in particular may cause difficulties in leveling the tip array with respect to the surface. Because elastomeric tips deform upon contact with the surface, tips that do not contact the surface simultaneously produce features of different dimensions, which has led to elaborate strategies for leveling the tip array with respect to the surface. Hard-tip soft spring lithography (HSL), which employs Si tips mounted onto an elastomeric backing, and tip arrays composed of a dual-elastomer, developed by Zheng et al., minimize the effects of leveling by providing a soft backing that allows all the tips in unleveled arrays to contact the surface simultaneously when a large force is applied between the tips and the array. However, both HSL and dual-elastomer tip arrays involve multistep fabrication protocols that increase the cost and challenge of employing those new materials in the context of nanolithography. Thus, there remains a need for alternative materials that would retain the simplicity characteristic to the fabrication of PDMS tip arrays while preserving the control over feature dimensions and to understand the role of the mechanical properties of the different materials on PPL printing.

SUMMARY OF THE INVENTION

One embodiment of the invention relates to a method of synthesizing tips for polymer pen lithograph. A polymer is selected from the group consisting of methacrylates, acrylates, elastomers, thiol-ene polymers and co-polymers thereof. The selected polymer is deposited into molds. The molds are covered with a support structure, the polymer adhering to the support structure. The support structure and tips comprising the selected polymer re removed from the molds.

In another implementation, a method of polymer pen lithography is provided. A plurality of polymer pen tips comprising a polymer selected from the group consisting of methacrylates, acrylates, elastomers, thiol-ene polymers and co-polymers thereof are provided. The plurality of polymer pen tips are coated with ink. A humidity of greater than about 55% is established. A meniscus is formed between the plurality of polymer pen tips and a printing substrate. Ink is transferred from the plurality of polymer pen tips to the printing substrate.

In another implementation, polymer pen lithography tips are described. The tips comprise a silanated support substrate and a polymer selected from the group consisting of methacrylates, acrylates, elastomers, thiol-ene polymers and co-polymers thereof.

Additional features, advantages, and embodiments of the present disclosure may be set forth from consideration of the following detailed description, drawings, and claims. Moreover, it is to be understood that both the foregoing summary of the present disclosure and the following detailed description are exemplary and intended to provide further explanation without further limiting the scope of the present disclosure claimed.

BRIEF DESCRIPTION OF THE DRAWINGS

The foregoing and other objects, aspects, features, and advantages of the disclosure will become more apparent and better understood by referring to the following description taken in conjunction with the accompanying drawings, in which:

FIG. 1 inset "a" illustrates chemical structures of the different polymers used to fabricate the tip arrays. FIG. 1 inset "b" illustrates that different tip materials compress differently when a force is applied between the tips and the surface, resulting in the features of FIG. 1 inset "c" of different sizes when printing. $L_{feature}$ is the feature edge length. F is the force that applied to the Au surface.

DETAILED DESCRIPTION OF THE PREFERRED EMBODIMENTS

Figure 1:
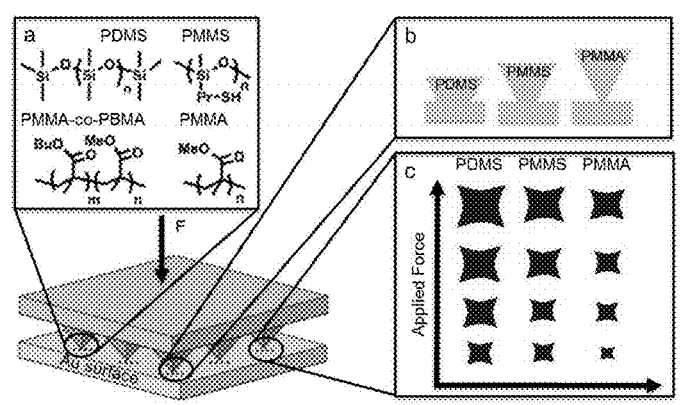
FIG. 1 illustrates PPL tip arrays prepared from different polymeric materials (PDMS, PMMA, PMMS).

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here. It will be readily understood that the aspects of the present disclosure, as generally described herein, and illustrated in the figures, can be arranged, substituted, combined, and designed in a wide variety of different configurations, all of which are explicitly contemplated and made part of this disclosure.

One embodiment of the present invention relates to materials that retain the simplicity characteristic for the fabrication of PDMS tip arrays while preserving the control over feature dimensions and to allow for an understanding of the role of the mechanical properties for the different materials on PPL printing. One implementation comprises fabrication of PPL tip arrays that are composed of one of poly(methyl methacrylate) (PMMA), poly([methyl methacrylate]-co-[butyl methacrylate]) (PMMA-co-PBMA), and poly(3-mercaptopropylmethylsiloxane) (PMMS) (FIG. 1). These materials exhibit ease of preparation, a broad range of mechanical properties between these different materials, and because they are prepared from readily available starting materials.

In one embodiment, the broad classes of materials for use in creating polymer tips for PPL are Methacrylates, Acrylates, elastomers, and thiol-ene polymers. In another embodiment, copolymers may be used, such as acrylate and methacrylate copolymers, PMMA-co-PBMA, PMMA-co-Polystyrene, PMMS-co-PS, and the like. Alternatively, the properties can be varied by keeping the polymer constant but changing the crosslinkers. For example, in the case of PMMS, a broad range of material with different crosslinkers could be investigated. By changing crosslinkers, the Young's moduli range from 4.8-47.3 MPa. Different crosslinkers can be used to alter wettability/hydrophobicity, which is important for applications such as tips in PPL. A nonlimiting list of PMMS crosslinks include: triallyl cyanurate (TAO); triallyl cyanurate/bisphenol A ethoxylate dimethacrylate (TAC/BPADMA); triallyl cyanurate/bisphenol A ethoxylate dimethacrylate/ethylene glycol diacrylate (TAC/BPADMA/EGDA); tetraethyleneglycol divinyl ether (TEGVE). An nonlimiting list of examples for methacrylate/acrylate crosslinkers includes: 2-hydroxyethyl methacrylate (HEMA); N,N'-methylenebisacrylamide (NMBA); Allyl methacrylate (AMA); Ethylene glycol dimethacrylate (EGDMA); N,N-dimethylaminopropylbenzamide; Cumyl peroxide.

Subsequently, the ability to print 1-mercaptohexadecanoic acid (MHA) onto Au-coated glass surfaces in the context of a PPL experiment was analyzed. The relationship between feature edge length and the force between the tip and the surface is dependent on the mechanical properties of the polymer that comprises the pyramidal tips. As further described below, implementations of and for making PPL tip arrays demonstrate that a relationship exists between the mechanical properties of the polymers used to fabricate the arrays and their printing properties.

EXPERIMENTAL

A major advantage of PPL over other tip-based molecular printing strategies is that, similar to soft lithography, tips are fabricated by curing polymers within molds that are prepared by conventional photolithographic processes. As a result, tip arrays composed of as many as $10^7$ tips can be made with a materials cost significantly lower than the price of a single AFM cantilever. In expanding the scope of polymers that can be used to form tip arrays, experiments were carried out to maintain the two aspects that make this tip fabrication protocol desirable: (1) fabrication by curing in a mold and (2) a single step curing procedure from readily available starting materials.

General Methods

All reagents and materials were purchased from Acros, Aldrich, Alfa Aesar, or VWR and used without further purification unless otherwise noted. $H_2SO_4$ (95-98% purity) was purchased from Macron Fine Chemicals. 3-methacryloxypropyltrimethoxysilane (MEMO) and poly(3-mercaptoproylmethylsiloxane) (PMMS) were purchased from Gelest, Inc. Methylmethacrylate (99% purity) and n-butylmethacrylate (99% purity) monomers were purchased from Alfa Aesar and Acros Organics respectively. 3" Si (100) Wafers (1-10 Ωcm) with 5000 Å thermal oxide were purchased from Nova Materials. Dry-column chromatography was performed on the methylmethacrylate and n-butylmethacrylate monomers over acidic aluminum oxide to remove the inhibitor, methyl ether of hydroquinone (MEHQ). Triethylene glycol divinyl ether was purchased from PolySciences, Inc. Shipley 1815 Photoresist, MCC primer, and MF319 developing solution were purchased from MicroChem, Inc. Solutions were prepared from nanopure water purified from Milli-Q plus system (Millipore Co. USA), with a resistivity of over 18 MΩ cm. A Park XE-150 Scanning Probe Microscope (Park Systems, Korea) equipped with a PPL head, an environmental chamber to control humidity, and custom lithography software was used for PPL printing. A Zeiss Merlin field emission scanning electron microscope (SEM) was used to characterize the tip arrays and patterns. A modular high vacuum coating system (Bal-tec MED 020, USA) was used to create gold films. An $O_2$ plasma cleaner (Harrick PDC-001, USA) was used to activate the array surfaces. Silicon masters, PDMS tip arrays, and Au surfaces were prepared according to published literature procedures.

After patterning, the surface was etched (20 mM thiourea, 30 mM iron nitrate, 20 mM hydrochloric acid, and 2 mM octanol in water) to yield raised Au structures. The Young's moduli were determined with a dynamic mechanical analyzer (DMA-Q900, dynamic time sweep at 1 Hz for 5 min at 10 μm amplitude, 0.1 N force at ambient conditions) and a rheometer (DHR 3, dynamic time sweep at 1 Hz, for 3 min at 0.05% strain and ambient conditions) from TA Instruments. The PDMS and PMMS rheology samples were prepared according to previously reported protocols, to make 1 mm thick discs with 2.5 cm diameters. The components for the PMMA cross-linked rheology samples were cured in a glass vial to prevent the monomer from evaporating.

PMMA Tip Fabrication

To activate the glass surface, a 1 cm² glass square was cut from microscope slides (Vistavision) and blown with a stream of $N_2$. The glass square was immersed in a 1:1 37% hydrochloric acid:MeOH solution for 30 min, rinsed with $H_2O$, and dried with a stream of $N_2$. The dried glass square was then placed in $H_2SO_4$ (concd) for 30 min, washed with $H_2O$, and dried with a stream of $N_2$. 3-methacryloxypropyltrimethoxysilane (MEMO) (1 mL, 1.05 g, 4.21 mmol) was added to 25 mL of toluene, and the activated glass surface was immersed in this solution for 1 h under $N_2$. Subsequently, the surface was rinsed with toluene and dried with a stream of $N_2$. The silanated glass surface was stored under $N_2$ until needed.

Methylmethacrylate (MMA) (9 mL, 8.46 g, 84.5 mmol), ethylene glycol dimethacrylate (EGDMA) cross-linker (1 mL, 1.05 g, 5.30 mmol, 11.1% v/v), and azobisisobutyronitrile (AIBN) initiator (0.1 g, 0.6 mmol, 1% w/v) were transferred to a 20 mL scintillation vial with a micro stir bar, and the solution was heated to 70° C. while stirring. The solution's viscosity was examined in 1 min intervals using a glass pipette. Once the viscosity of the mixture increased, it was rapidly cooled in an ice bath for 10 min, then allowed to warm to ambient temperature. Using a 1 mL plastic syringe, 0.5 mL of the solution was drop cast onto the silicon master, and the silanated glass was stabilized on top of the master. The polymer-filled mold was heated to 50° C. for 15 h, and then cooled to room temperature. The glass was carefully peeled away from the silicon master with a razor to yield a PMMA tip array adhered to the glass support.

PMMA-Co-PBMA Tip Fabrication

PMMA-co-PBMA tip arrays were fabricated according to the same procedures as for PMMA but with varying ratios of MMA:BMA. Ratios of 50:50, 60:40, 70:30, 80:20, and 90:10 were fabricated.

PMMS Tip Array Fabrication

A 1:1 w/w solution of mercaptopropyl methylsiloxane (MMS) and tetraethylene glycol divinylether (TEGVE) was mixed with <0.1 wt % 2,2-dimethoxy-2-phenylacetophenone (DMPA) photoinitiator. The resulting mixture was drop cast onto the silicon masters, covered with a MEMO silanized 1 cm² glass support, and exposed to a UV lamp (4.6 mW cm$^{-2}$, 365 nm) for 1-2 min. The glass was carefully peeled away from the mold with a razor blade to yield the PMMS tip array adhered to a glass support.

PPL Printing

To prepare Au surfaces, microscope slides were sonicated in EtOH for 2×30 min, followed by an EtOH wash. 5 nm of Cr was thermally evaporated on the cleaned glass slides followed by a 50 nm Au thermal evaporation. The PMMA tips were exposed to $O_2$ plasma for 30 s to increase surface hydrophilicity, while PMMS tip arrays did not require $O_2$ plasma. The humidity in the environmental chamber was increased to the appropriate level. Patterns were generated with a custom lithography software program. Z-extension was measured relative to the first point of contact.

EXPERIMENTAL RESULTS

PMMA Tip Arrays

PMMA was chosen as a tip material because of its low cost, superior optical properties, and stiffness. Methyl methacrylate (MMA) is a commodity chemical whose conversion into PMMA proceeds under numerous conditions. As such, it is believed that a number of processes could be used to form the tip arrays. Moreover, PMMA is often used in optics and has significantly better transparency, particularly in the UV spectrum, than PDMS, so these arrays would be suitable for applications that combine elements of optical lithography and PPL, such as Beam Pen Lithography. Finally, because PMMA is significantly stiffer than PDMS, it is believed that the reduced deformation of PMMA would decrease the dependence between force and feature size, which is desirable in certain PPL printing applications because reduced deformation simplifies leveling. Further, arrays that deform less possess the potential to make smaller features.

Figures 2A, 2B, 2C, 2D, 2E, 2F, 2G:
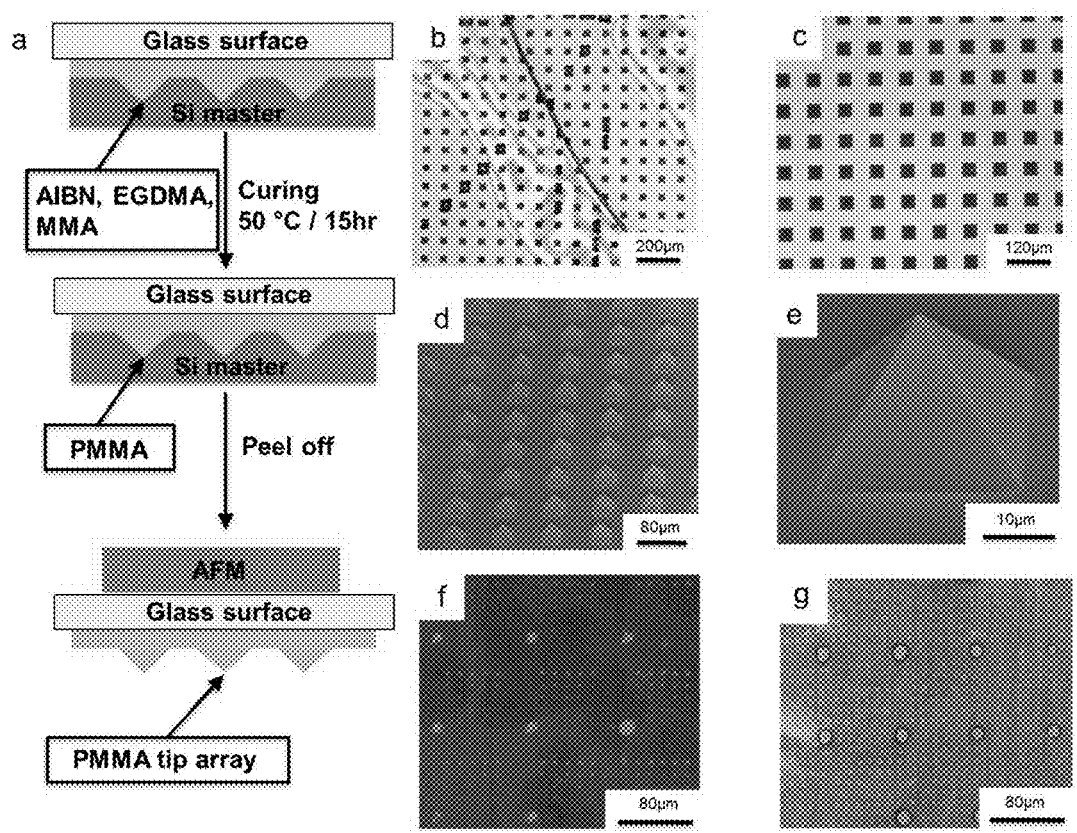
FIG. 2a illustrates PMMA tip-array fabrication.
FIG. 2b is an optical microscope image of PMMA tip array without silanization of the glass support.
FIG. 2c is an optical microscope image of PMMA tip array after silanization with MEMO.
FIG. 2d is a SEM image of PMMA tip array.
FIG. 2e is a SEM image of a single PMMA tip.
FIG. 2f is an image of a 5×5 Au dot array deposited by PMMA tip, each row has different tip contact time but the same Z-extension.
FIG. 2g is an image of a 7×7 Au dot array deposited by PMMA tip, each row has different Z-extension but same tip contact time.

To fabricate PMMA tip arrays, a mixture of MMA, ethylene glycol dimethacrylate (EGDMA) cross-linker, and azobisisobutyronitrile (AIBN) initiator was prepared and heated to 70° C. for approximately 10 min to initiate the radical polymerization, and thereby increase the prepolymer viscosity. Upon observing that the viscosity had increased, 0.5 mL of the mixture was dropcast onto the tip mold—a Si master with $10^4$ wells and a well-to-well spacing of 80 μm that was prepared by following previously reported protocols. The filled mold was covered with a glass support that had been activated in $O_2$ plasma to improve adhesion with the polymer, and the mixture was cured for 15 h at 50° C. (FIG. 2a). The resulting arrays did not adhere well to the glass support needed to mount them onto the AFM, as evidenced by the rippled surface observed in the optical micrograph (FIG. 2b), so these arrays could not be used for printing.

A new approach for fabricating the tip arrays was devised that involved functionalizing the glass support with 3-methacryloxypropyltrimethoxysilane (MEMO) to ensure adhesion between the polymer and the glass surface via participation of the surface in the radical polymerization. Following MEMO silanization of the glass support, the PMMA tip arrays were prepared as described above. The resulting arrays were peeled from the mold, and the array uniformity was confirmed by optical microscopy (FIG. 2c) and by scanning electron microscopy (SEM) (FIGS. 2d and 2e), showing evenly spaced PMMA pyramids on a flat surface.

The PMMA arrays were used to pattern MHA onto Au-coated glass surfaces and to explore how the polymer influences the PPL deposition process and compare the time- and force-dependent dot arrays to those prepared by other materials. MHA was spin coated onto the PMMA arrays. Then the tip arrays were leveled optically with respect to the surface and 7×7 dot arrays with dwell-times of 20-2000 ms were printed at a constant Z-piezo extension. For one embodiment, unlike PDMS, where an aqueous meniscus forms at approximately 45% humidity, for PMMA it was necessary to increase the humidity to 75% to print. After etching the Au from areas where MHA had not been deposited, the patterns were analyzed by optical microscopy to reveal uniform dot arrays over the 1 cm² area of the surface (FIG. 2f). It was observed that feature diameters increased with increasing dwell time, confirming the ability of PMMA to transfer ink molecules to a surface through an aqueous meniscus and also confirming the linear relationship between dwell-time$^{1/2}$ and feature size.

To examine how the force between PMMA tip arrays and surfaces affects the edge lengths of the resulting features, 7×7 patterns of MHA dots were printed onto a Au-coated glass surface at 80% humidity, a dwell-time of 500 ms, and with Z-piezo extensions of 2, 4, 6, 8, 6, 4, and 2 μm. The Z-piezo extension was successively increased and decreased for each line in the pattern to assess the reversibility of any tip compression that occurs at high extensions. After etching the Au from areas where MHA was not deposited, the resulting patterns were analyzed by SEM (FIG. 2g). Uniform patterns were observed across the length of the array, and feature edge lengths increased with increasing force. These experiments confirm the ability of PMMA tip arrays to transfer MHA ink at high Z-piezo extensions, that feature edge lengths do increase with increasing force, and that the PMMA tips are resilient under stress.

PMMA-co-PBMA Tip Arrays

Figures 3A, 3B, 3C, 3D, 3E, 3F, 3G:
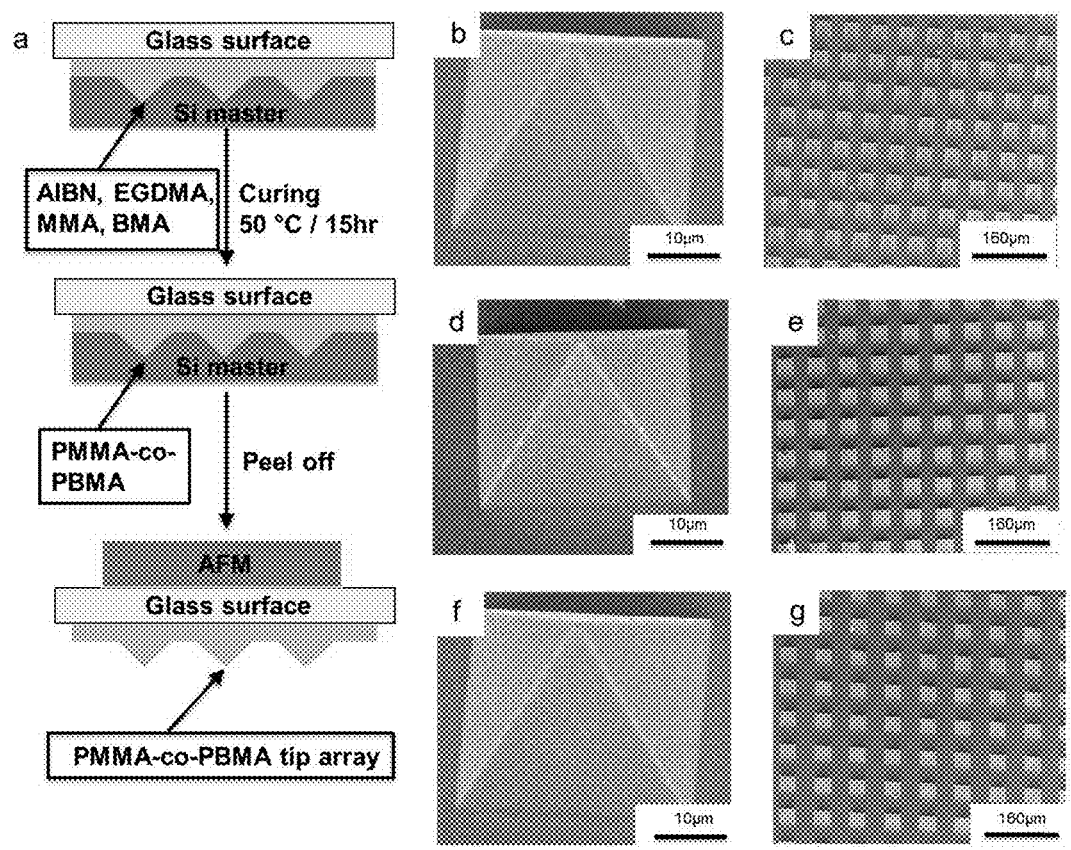
FIG. 3a illustrates an embodiment of PMMA-co-PBMA tip-array fabrication.
FIG. 3b is a SEM image of a single PMMA/BMA (70/30) tip.
FIG. 3c is a SEM image of PMMA/BMA (70/30) tip array.
FIG. 3d is a SEM image of a single PMMA/BMA (80/20) tip.
FIG. 3e is a SEM image of PMMA/BMA (80/20) tip array.
FIG. 3f is a SEM image of a single PMMA/BMA (90/10) tip.
FIG. 3g is a SEM image of PMMA/BMA (90/10) tip array.

PMMA-co-PBMA copolymer was also investigated as a potential substitute for PDMS in PPL tip arrays because, like PMMA, it is an inexpensive polymer with excellent optical properties and can be cast in a mold. Moreover, the stiffness of PMMA-co-PBMA copolymer can be tuned by varying the ratio of the MMA and BMA monomers, so it is believed that with this copolymer system the impact of the Young's modulus and other polymer mechanical properties on force-dependent feature sizes could be investigated systematically and tuned as necessary. Tip arrays comprised of PMMA-co-PBMA copolymers were fabricated onto MEMO functionalized glass slides following an identical synthetic protocol used for the PMMA tips with MMA:BMA ratios of 50:50, 60:40, 70:30, 80:20, and 90:10 (FIG. 3a). After peeling the tip arrays from the mold, the uniformity of the pyramidal PMMA-co-PBMA tips for all compositions was confirmed by SEM (FIGS. 3b-3g).

Following their fabrication, the PMMA-co-PBMA tip arrays were evaluated for their ability to pattern surfaces in the context of a PPL experiment. Initially, the tip arrays were inked with MHA by spin coating, leveled by optical methods, and patterning was attempted. During initial printing trials, it was observed that PMMA-co-PBMA tip arrays fabricated with a BMA percentage greater than 30% lacked robustness and underwent permanent deformation after contacting the surface.

Additionally, despite varying the humidity (70%-80%), dwell-times (10-2000 ms), Z-piezo extensions (0-8 μm), and inking protocols to include spin coating or immersion of the tips into a saturated ink solution, no patterns were observed after etching. Presumably, the addition of BMA increases the hydrophobicity of the tips, so that the meniscus that is the conduit from the tips to the surface does not form, thereby preventing the ink transfer. Therefore, a systematic investigation of the role of the PMMA-co-PBMA mechanical properties on force-dependent feature sizes was not possible. It is believed that crosslinkers can be selected to increase the wettability/hydrophobicity of the tips. For example, a hydrophilic crosslinker may be utilized to enable a meniscus to form and the ink to transfer.

PMMS Tip Arrays

In another implementation, the time necessary to fabricate tip arrays was investigated and reduced. Preparing conventional PDMS tip arrays is a multistep process that takes several days to complete. Similarly, making HSL tip arrays also involves several wet etching steps and is a lengthy and involved process. As a consequence, there is a desire to explore new tip array materials that have equivalent or superior printing properties to those composed of PDMS and whose fabrication can be accomplished in minutes rather than days. PMMS is a polysiloxane that is cross-linked using thiol-ene "click" chemistry with various alkene-containing monomers. This simple radical reaction can proceed thermally or photochemically in the presence of oxygen to produce highly cross-linked polymers in as little as 1 min. Additionally, different alkene cross-linkers can be added to tune the Young's moduli from 4.8-47.3 MPa, and these materials have been successfully employed in soft lithographic applications, yielding patterns with sub-50 nm features.

Figures 4A, 4B, 4C, 4D, 4E:
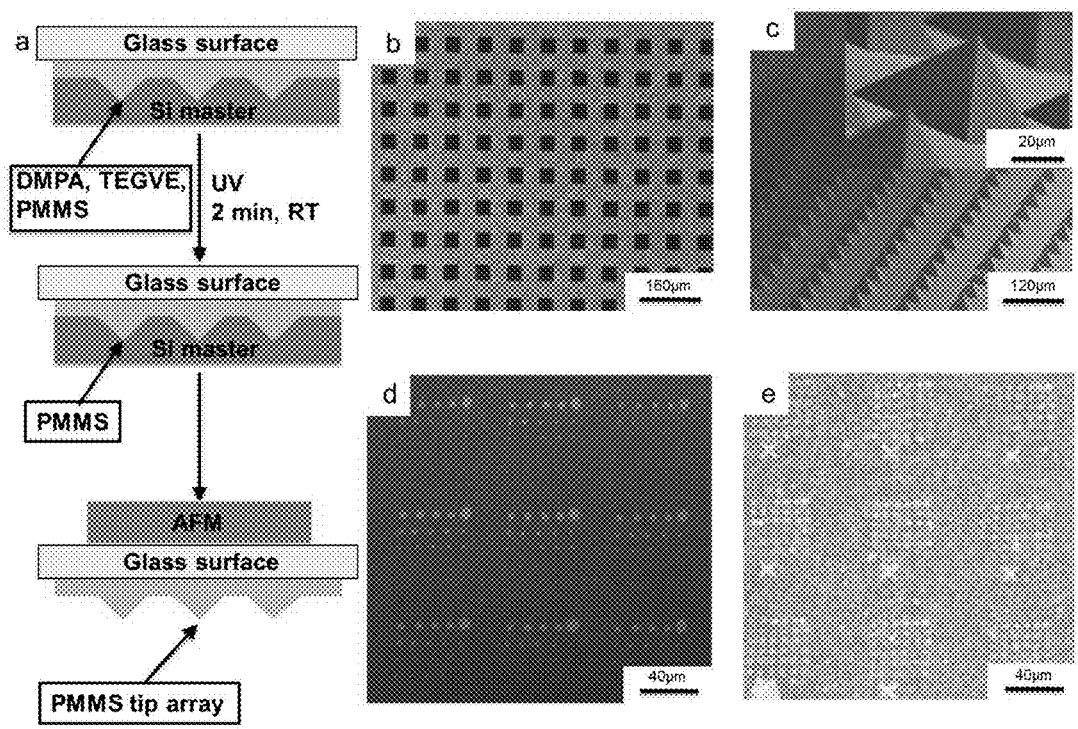
FIG. 4a illustrates an embodiment of PMMS tip-array fabrication.
FIG. 4b is an optical microscope image of PMMS tip array.
FIG. 4c is a SEM image of PMMS tip array.
FIG. 4d is an optical microscope image of 5×5 MHA dot array deposited by PMMS tip, each row has a different tip contact time but the same Z-extension.
FIG. 4e is a SEM image of 6×6 MHA dot array deposited by PMMS tip, each row has different Z-extension but same tip contact time.

To fabricate PMMS tip arrays, a mixture of poly(3-mercaptoproylmethylsiloxane) (PMMS), tetraethyleneglycol divinylether (TEGVE) cross-linker, and 2,2-dimethoxy-2-phenylacetophenone (DMPA) photoinitiator was cast onto the tip mold. The filled mold was covered with a MEMO-functionalized glass support and irradiated with a UV lamp (4.6 mW cm$^{-2}$, 365 nm) for 2 min to cure the polymer (FIG. 4a). The resulting arrays were peeled from the mold and the array uniformity was characterized by optical microscopy (FIG. 4b) and by SEM (FIG. 4c), confirming that PMMS tips can be made in minutes rather than hours or days.

The PMMS arrays were used to pattern MHA onto Au-coated glass substrates to confirm the suitability of PMMS as a component for PPL tip-arrays. To study the time-dependent printing of PMMS tip arrays, MHA was coated onto the tips by immersing the arrays in a saturated ethanolic solution of MHA, the tip arrays were leveled optically, and 5×5 dot patterns were printed with dwell-times ranging from 200-5000 ms and constant Z-piezo extension. The patterns were printed at 45%, 55%, 60%, 70% and 80% humidity, with 60% humidity providing the most uniform patterns, while humidity below 55% did not result in any patterns, presumably because of the lack of a suitable aqueous meniscus. After etching to remove the exposed Au, the 5×5 dot patterns were characterized by optical microscopy (FIG. 4d), with a linear increase in feature diameter with increasing dwell-time, confirming the ability of PMMS to print through an aqueous meniscus and confirming a relationship between dwell-time$^{1/2}$ and feature size. To examine the force-dependent printing of the PMMS tip arrays, 6×6 MHA dot patterns were printed onto Au-coated glass at 55% humidity, a dwell-time of 500 ms, and Z-piezo extensions of 0, 1, 2, 3, 4, and 5 µm. After etching the exposed Au, the patterns were analyzed by SEM (FIG. 4e), confirming the ability of PMMS to transfer ink at high Z-piezo extensions, and verifying the linear relationship between feature edge length and Z-piezo extension that is one of the hallmarks of using elastomeric tip arrays in PPL.

Comparison of PDMS, PMMA, and PMMS Printing Properties

Figures 5A, 5B:
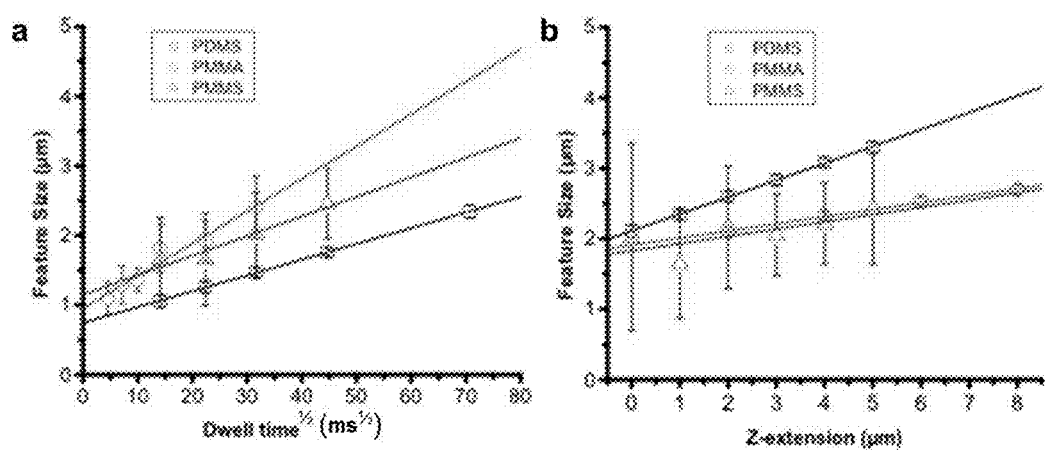
FIG. 5a illustrates the relationship between Feature Diameter and Dwell Time$^{1/2}$ for PDMS, PMMA, and PMMS tip arrays.
FIG. 5b illustrates the relationship between Feature Edge Length and Z-piezo extension for PDMS, PMMA, and PMMS.

The time-dependent patterns prepared with PDMS, PMMA, and PMMS tips were compared to determine how humidity affected the ink deposition process. The feature diameters were measured on 10 spots for each dwell-time, from patterns across the printed surfaces, and for all three materials. The expected linear dependence between feature diameter and dwell-time$^{1/2}$ was observed for all materials, however, the slopes of each line varied in the order PMMA>PMMS≅PDMS (FIG. 5a). It is believed that this variation in slopes is due to the differences in humidity (75% for PMMA, 60% for PMMS, and 45% for PDMS).

The force-dependent printing characteristics of the different polymers were compared by plotting feature edge length vs. Z-piezo extension at identical dwell-times (500 ms). For each of the three polymers investigated, PMMA, PMMS, and PDMS, feature edge lengths increased linearly with increasing Z-piezo extension, as expected (FIG. 5b). The slopes of the linear regression lines of the curves increased as PDMS>PMMS≅PMMA meaning that the features printed with PDMS possess the greatest dependence on force for identical dwell-times. The Young's moduli of the three materials were measured and vary in the order from soft to stiff as, ca. 2 MPa in PDMS, ca. 5 MPa in PMMS, and ca. 3 GPa in PMMA. Interestingly, it was observed that the slope does not vary widely between PMMS and PMMA (FIG. 5b). Thus, it is believed that the stiffness of the material transfers the pattern with minimal changes of the feature edge length with increasing force after a certain value for the modulus is surpassed.

EXPERIMENTAL CONCLUSIONS

The different tip materials explored herein for fabricating PPL tip arrays—PDMS, PMMA, PMMA-co-PBMA, and PMMS—have significantly different fabrication protocols and printing properties. The softest material, PDMS, displayed the strongest dependence of feature edge length on the applied force, but requires a lengthy fabrication process and the tip arrays of this material must be finely leveled with respect to the surface to achieve uniform patterning. The stiffer PMMA is broadly used for optical applications, had less dependence between feature edge length and force and was easier to level, but requires high humidity for successful pattern transfer. PMMA/PBMA copolymers could be used to test the influence of mechanical properties on printing, they did not successfully transfer ink to the surface. PMMS tip arrays have a smaller dependence between force and feature edge length than PDMS, while fabrication takes minutes and printing can be conducted at a modest 60% humidity. Additionally, it has been shown that the stiffness of PMMS can be tuned by varying the cross-linker used in fabrication, so the relationship between mechanical properties and printing properties can be tuned systematically, while using the same fabrication protocol. This study demonstrates that PPL tip arrays can be prepared from numerous polymeric materials for the purposes of molecular printing, and that by expanding the library of compatible polymers, researchers can select and systematically adjust the polymers' mechanical properties to attain the desired printing properties.

The foregoing description of illustrative embodiments has been presented for purposes of illustration and of description. It is not intended to be exhaustive or limiting with respect to the precise form disclosed, and modifications and variations are possible in light of the above teachings or may be acquired from practice of the disclosed embodiments. It is intended that the scope of the invention be defined by the claims appended hereto and their equivalents.

What is claimed is:

1. A method of synthesizing tips for polymer pen lithography comprising:
    silanating a support structure comprising a glass material;
    selecting a polymer selected from the group consisting of methacrylates, acrylates, elastomers, thiol-ene polymers and co-polymers thereof;
    depositing the selected polymer into molds;
    covering the molds with the glass support structure, the polymer adhering to the support structure; and
    removing the support structure and tips which comprise the selected polymer from the molds;
    wherein silanating is done prior to covering the molds and comprises:
    immersing the glass support structure in an acid bath;
    removing the glass support structure from the acid bath;
    drying the glass support structure with an inert gas;
    placing the dried glass support structure in an organic silane solution comprising 3-methacryloxypropyltrimethoxysilane (MEMO) and toluene.

2. The method of claim 1, wherein the polymer is selected from the group consisting of poly(methyl methacrylate) (PMMA), poly([methyl methacrylate]-co-[butyl methacrylate]) (PMMA-co-PBMA), and poly(3-mercaptopropylmethylsiloxane) (PMMS).

3. The method of claim 1, further comprising adding a crosslinker.

4. The method of claim 3 wherein the crosslinker is hydrophilic.

5. The method of claim 1, wherein prior to immersion in the acid bath:
    immersing the glass substrate in an acid/alcohol bath;
    removing the glass substrate from the acid/alcohol bath; and
    drying the glass substrate with the inert gas.

6. A method of synthesizing tips for polymer pen lithography comprising:
    silanating a support structure comprising a glass material, by:
        immersing the glass support substrate in an acid/alcohol bath;
        removing the glass support substrate from the acid/alcohol bath; and
        drying the glass support substrate with the inert gas;
    followed by:
        immersing the glass support substrate in an acid bath;
        removing the glass support substrate from the acid bath;
        drying the glass support substrate with an inert gas;
        placing the dried glass support substrate in an organic silane solution;

selecting a polymer selected from the group consisting of methacrylates, acrylates, elastomers, thiol-ene polymers and co-polymers thereof;

depositing the selected polymer into molds;

covering, after silanating, the molds with a support structure, the polymer adhering to the support structure; and removing the support structure and tips which comprise the selected polymer from the molds.

7. The method of claim 6, wherein the polymer is selected from the group consisting of poly(methyl methacrylate) (PMMA), poly([methyl methacrylate]-co-[butyl methacrylate]) (PMMA-co-PBMA), and poly(3-mercaptopropylmethylsiloxane) (PMMS).

8. The method of claim 6, further comprising adding a crosslinker.

9. The method of claim 8 wherein the crosslinker is hydrophilic.

10. The method of claim 6, wherein the organic silane solution comprises 3-methacryloxypropyltrimethoxysilane (MEMO) and toluene.

* * * * *